United States Patent
Wu et al.

(10) Patent No.: US 10,366,900 B2
(45) Date of Patent: Jul. 30, 2019

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Juing-Yi Wu, Hsinchu (TW); Liang-Yao Lee, Taoyuan (TW); Tsung-Chieh Tsai, Chu-Bei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 12 days.

(21) Appl. No.: 15/081,800

(22) Filed: Mar. 25, 2016

(65) Prior Publication Data

US 2017/0278717 A1 Sep. 28, 2017

(51) Int. Cl.
| H01L 21/3105 | (2006.01) |
| H01L 21/265 | (2006.01) |
| H01L 21/8234 | (2006.01) |
| H01L 27/088 | (2006.01) |
| H01L 29/06 | (2006.01) |
| H01L 21/768 | (2006.01) |

(52) U.S. Cl.
CPC ...... *H01L 21/31055* (2013.01); *H01L 21/265* (2013.01); *H01L 21/31053* (2013.01); *H01L 21/76819* (2013.01); *H01L 21/76825* (2013.01); *H01L 21/76829* (2013.01); *H01L 21/76837* (2013.01); *H01L 21/823431* (2013.01); *H01L 21/823437* (2013.01); *H01L 21/823481* (2013.01); *H01L 27/0886* (2013.01); *H01L 29/0649* (2013.01)

(58) Field of Classification Search
CPC ......... H01L 21/31055; H01L 21/02329; H01L 21/0234; H01L 21/82341; H01L 21/823481; H01L 21/302; H01L 21/304; H01L 21/30625; H01L 29/785–7856
See application file for complete search history.

(56) References Cited

U.S. PATENT DOCUMENTS

| 5,212,114 | A | * | 5/1993 | Grewal | H01L 21/31055 257/E21.245 |
| 5,554,560 | A | * | 9/1996 | Hsue | H01L 21/31055 257/E21.245 |
| 5,635,428 | A | * | 6/1997 | Martin | H01L 21/76819 257/E21.576 |
| 5,792,707 | A | * | 8/1998 | Chung | H01L 21/76819 257/E21.244 |
| 5,854,133 | A | * | 12/1998 | Hachiya | H01L 21/304 438/692 |

(Continued)

*Primary Examiner* — Tuan A Hoang
(74) *Attorney, Agent, or Firm* — McDermott Will & Emery LLP (57) ABSTRACT

In a method for manufacturing a semiconductor device, a first dielectric layer is formed over an underlying structure disposed on a substrate. A planarization resistance layer is formed over the first dielectric layer. A second dielectric layer is formed over the first dielectric layer and the planarization resistance layer. A planarization operation is performed on the second dielectric layer, the planarization resistance layer and the first dielectric layer. The planarization resistance film is made of a material different from the first dielectric layer.

20 Claims, 6 Drawing Sheets

(56) References Cited

U.S. PATENT DOCUMENTS

| | | | | |
|---|---|---|---|---|
| 7,779,785 | B2 * | 8/2010 | Miya | C23C 16/345 |
| | | | | 118/696 |
| 8,247,275 | B2 * | 8/2012 | Hoentschel | H01L 29/045 |
| | | | | 257/E21.442 |
| 8,466,490 | B2 * | 6/2013 | Liu | H01L 29/785 |
| | | | | 257/139 |
| 8,691,673 | B2 * | 4/2014 | Chuang | H01L 21/31055 |
| | | | | 257/E21.057 |
| 8,723,272 | B2 * | 5/2014 | Liu | H01L 29/66795 |
| | | | | 257/401 |
| 8,878,309 | B1 * | 11/2014 | Hong | H01L 27/0886 |
| | | | | 257/401 |
| 2013/0285141 | A1 * | 10/2013 | Kuo | H01L 29/66545 |
| | | | | 257/347 |
| 2017/0117157 | A1 * | 4/2017 | Chen | H01L 21/31051 |

* cited by examiner

SEMICONDUCTOR DEVICE AND MANUFACTURING METHOD THEREOF

TECHNICAL FIELD

The disclosure relates to a semiconductor integrated circuit, more particularly to a method for fabricating a semiconductor device including planarization operations, such as chemical mechanical polishing.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin devices (e.g., wrapping) utilizing the advantage of the increased surface area of the channel and source/drain regions to produce faster, more reliable and better-controlled semiconductor transistor devices. One or more interlayer dielectric (dielectric) layers are formed over the fin structures and/or gate structures, and a planarization operation, such as a chemical mechanical polishing process, is performed on the dielectric layer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1-8 are cross sectional views illustrating exemplary sequential processes for manufacturing a semiconductor device according to one embodiment of the present disclosure. FIGS. 1-8 illustrate exemplary sequential processes for fabricating one of dielectric layers, which are formed over underlying structures and a substrate. The underlying structures include, for example, fin structures, gate structures, metal wirings and combination thereof. The detailed illustrations of the underlying structures and/or any additional elements are simplified or are omitted in FIGS. 1-8.

Figure 1:
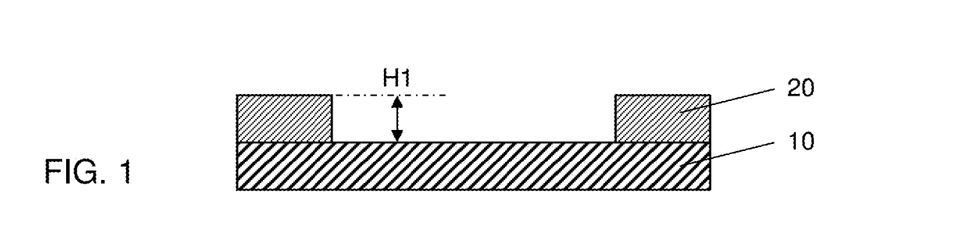
FIGS. 1-8 show exemplary sequential processes for manufacturing a semiconductor device according to one embodiment of the present disclosure.
Figure 2:
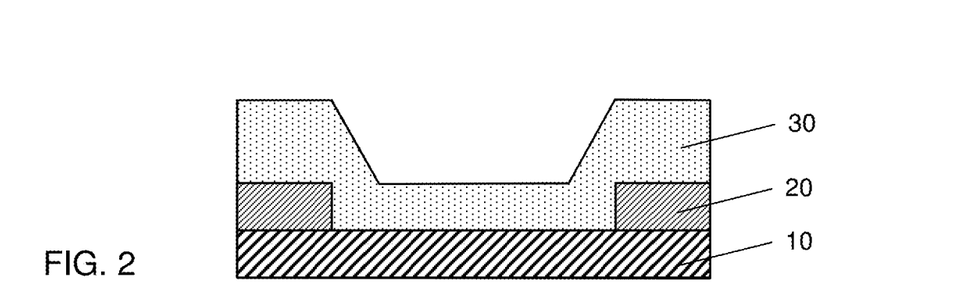

As shown in FIG. 1, underlying structures 20 are disposed over a substrate 10. In FIG. 2, a first dielectric layer 30 is formed over the underlying structures 20 and the area of the substrate 30 where the underlying structures are not disposed. The first dielectric layer 30 is made of, for example, one or more layers of silicon oxide based insulating materials, such as $SiO_2$, TEOS (tetraethyl orthosilicate) or BPSG (borophosphosilicate glass), or low-k dielectric material. Low-k dielectric materials have a k-value (dielectric constant) lower than about 4.0. Some low-k dielectric materials have a k-value lower than about 3.5 and may have a k-value lower than about 2.5.

The materials for the first dielectric layer 30 may also include elements of Si, O, C and/or H, such as SiCOH and SiOC. Organic material such as polymers may be used for the first dielectric layer 30. For example, the first dielectric layer 30 is made of one or more layers of a carbon-containing material, organo-silicate glass, a porogen-containing material, and/or combinations thereof.

The first dielectric layer 30 may be formed by using, for example, plasma-enhanced chemical vapor deposition (PECVD), low pressure CVD (LPCVD), flowable CVD, atomic layer CVD (ALCVD), and/or a spin-on technology. The thickness of the first dielectric layer 30 is in a range from about 500 nm to about 1500 nm in some embodiments.

Figure 3:
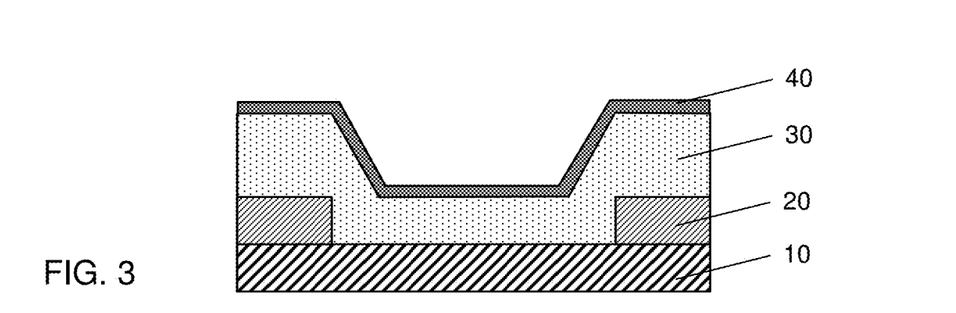

Then, as shown in FIG. 3, a planarization resistance film 40 is formed over the first dielectric layer 30 by using PECVD, LPCVD or other suitable film forming method. The planarization resistance film 40 includes a material having a lower etching rate in the subsequent planarization operation (e.g., chemical mechanical polishing (CMP)) than the first dielectric layer 30. In some embodiments, the planarization resistance film includes one or more layers of silicon nitride based insulating materials, such as SiN, SiON or SiCN, silicon carbide (SiC), or aluminum based insulating material, such as AlO or AlON. The thickness of the planarization resistance film 40 is in a range from about 50 nm to about 300 nm in some embodiments, and is in a range from about 100 nm to about 200 nm in other embodiments.

Figure 4:
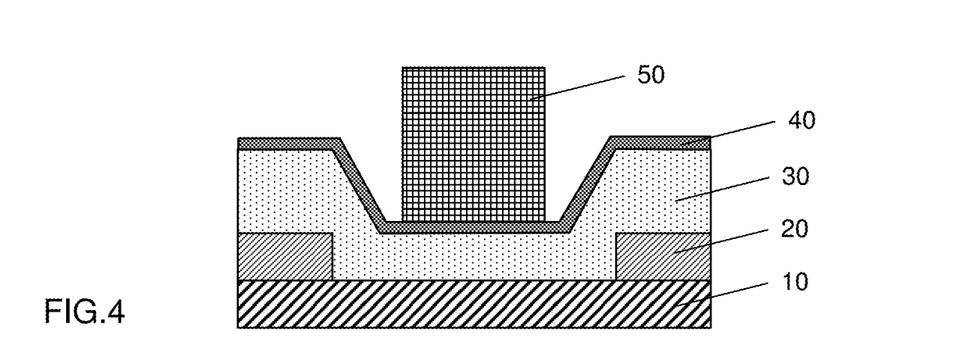
Figure 5:
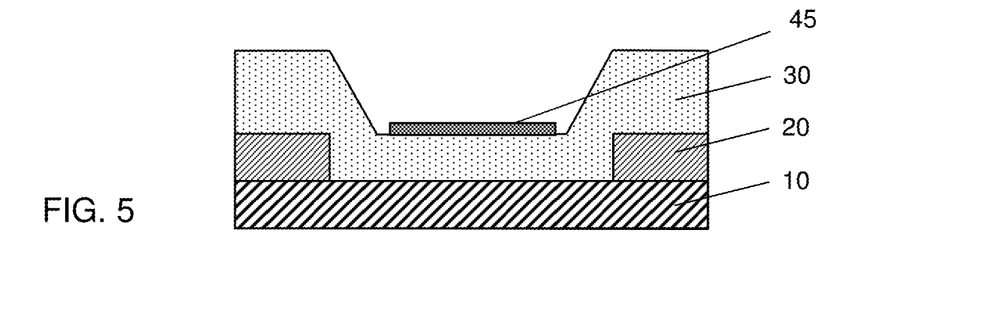

As shown in FIGS. 4 and 5, patterning operations including lithography and etching processes are performed on the planarization resistance film 40 to obtain a planarization resistance layer 45. In some embodiments, a mask layer 50, such as a photo resist layer or a hard mask layer, is formed over the planarization resistance film 40, as show in FIG. 4. Then, the planarization resistance film 40 is etched to obtain a planarization resistance layer 45, as shown in FIG. 5.

As shown in FIG. 5, the planarization resistance layer 45 is formed over a concave portion of the first dielectric layer 30. In the concave portion, the height of the upper surface of the first dielectric layer 30 from the substrate 10 is lower than the height of the upper surface of the first dielectric layer 30 formed in another area, for example, on the underlying structures 20. In particular, the concave portion is formed in the area of the substrate 10, in which no underlying structure 20 is formed. The size of the concave portion is more than 50 $nm^2$ in some embodiments.

In some embodiments, the underlying structures 20 include plural patterns, for example, fin structures, gate structures, or conductive patterns, and are disposed in a dense area of the substrate 10. The planarization resistance layer 45 is formed over a coarse area (substantially corresponding to the concave portion) where a density of the plural structures is less than a threshold density. In one embodiment, the threshold density can be determined by a space between the plural structures. For example, the dense area is an area where the distance between adjacent underlying patterns is equal to or less than a threshold space Si and the coarse area is an area between adjacent underlying patterns, of which distance is more than the threshold space Si. In some embodiments, the threshold space Si is k×a minimum space between adjacent underlying patterns in the dense area, where k is more than one (1). In certain embodiments, k is 2, 3, 4 or more.

Figure 6:
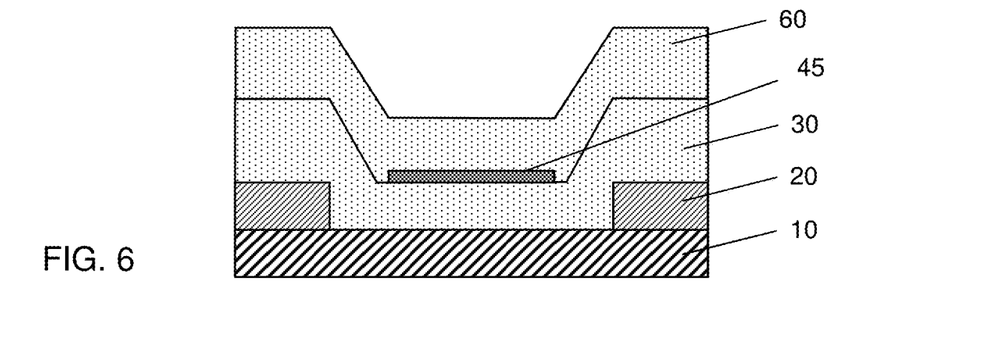

Subsequently, a second dielectric layer 60 is formed over the planarization resistance layer 45 and the first dielectric layer 30, as shown in FIG. 6. Similar material and film forming methods as the first dielectric layer 30 can be employed to form the second dielectric layer 60. The thickness of the second dielectric layer 60 is in a range from about 50 nm to about 300 nm in some embodiments, and is in a range from about 100 nm to about 200 nm in other embodiments.

Figure 7:
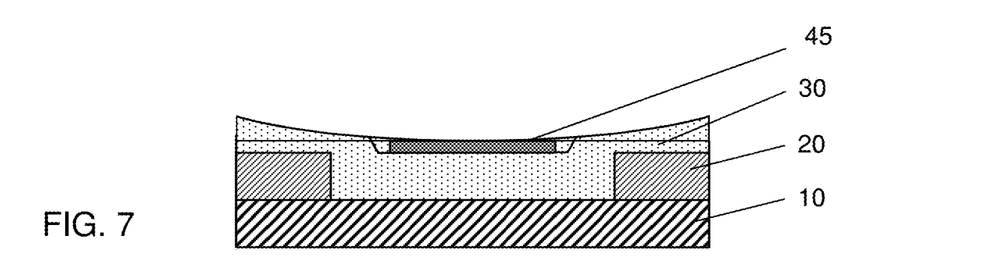
Figure 8:
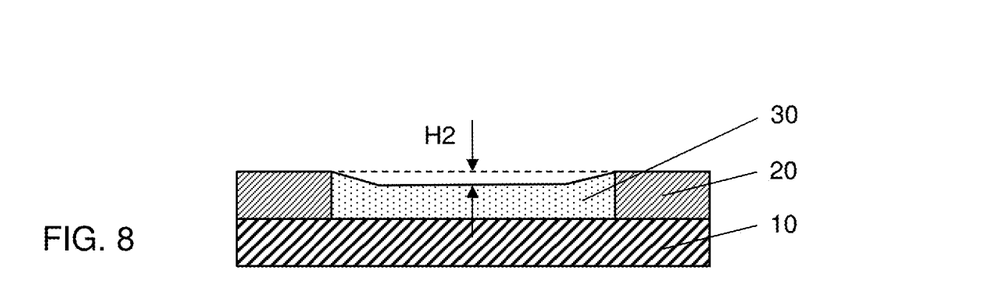

As shown in FIGS. 7 and 8, a planarization operation, such as an etch-back operation or CMP, is performed on the second dielectric layer 60, the planarization resistance layer 45 and the first dielectric layer 30.

The second dielectric layer 60 in the coarse area (concave portion) is etched or polished faster than in the dense area above the underlying structures 20. After the planarization resistance layer 45 is exposed, as shown in FIG. 7, since the etching speed of the planarization resistance layer 45 is slower than the first and second dielectric layers, the etching speeds at the dense area and the coarse area can be balanced. As a result, as shown in FIG. 8, the planarized first dielectric layer with a flatter surface profile than the case when no planarization resistance layer is used can be obtained. In other words, a so-called "dishing effect" can be reduced.

In some embodiments, the dishing amount H2, which is a difference in height between the lowest portion of the upper surface of the first dielectric layer 30 and the local highest portion of the upper surface of the first dielectric layer near the coarse area, is in a range from about 15% to about 30% of a dishing amount when the planarization resistance layer 45 is not used. In certain embodiments, the dishing amount H2 is in a range from about 1 nm to about 10 nm.

Figure 9:
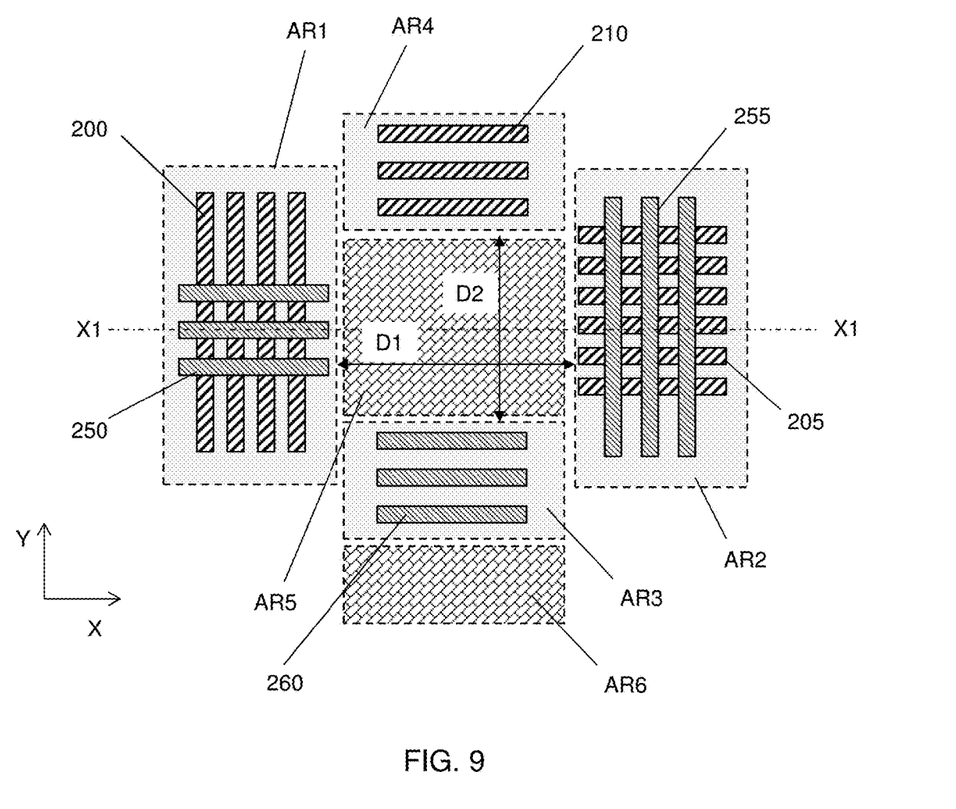
FIG. 9 shows an exemplary layout structure of a semiconductor device according to one embodiment of the present disclosure.

FIG. 9 shows an exemplary layout structure of a semiconductor device according to one embodiment of the present disclosure. FIG. 9 illustrates an exemplary layout structure of fin structures and gate structures (gate electrodes), which forms one or more fin field effect transistors (FinFETs).

In an area AR1 of FIG. 9, fin structures 200 extending in the Y direction are disposed, while gate structures 250 extending in the X direction are disposed over the fin structures, and in an area AR2 of FIG. 9, fin structures 205 extending in the X direction are disposed, while gate structures 255 extending in the Y direction are disposed over the fin structures. Further, in area AR3, dummy gate structures 260 are disposed, and in area AR4, dummy fin structures 210 are disposed. In other embodiments, areas AR3 and AR4 include active (not dummy) gate structures and/or fin structures.

In the areas AR1 and AR2, the fin structures and/or the gate structures are arranged with a certain space Sf and/or Sg, respectively. The dummy structures in areas AR3 and AR4 may have the similar arrangement. In contrast, in an area AR5, no fin structures and no gate structures are disposed.

The distance D1 between areas AR1 and AR2 and the distance D2 between areas AR3 and AR4 are k×Sf or k×Sg, where k is more than one (1). In certain embodiments, k is 2, 3, 4 or more.

FIGS. 10-17 show exemplary sequential processes for manufacturing a semiconductor device according to one embodiment of the present disclosure. FIGS. 10-17 show exemplary cross sectional view corresponding to the line X1-X1 of FIG. 9. The same or similar operations, processes, configuration and/or materials as set forth with respect to FIGS. 1-8 may be employed in the following embodiments, and the detailed explanation may be omitted.

Figure 10:
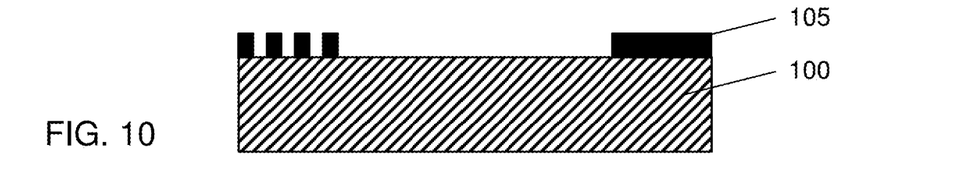
FIGS. 10-17 show exemplary sequential processes for manufacturing a semiconductor device according to one embodiment of the present disclosure.

As show in FIG. 10, a mask layer 105 is formed over a substrate 100 made of, for example, Si. The patterns of the mask layer correspond to the fin structures 200 and 205 of FIG. 9.

Figure 11:
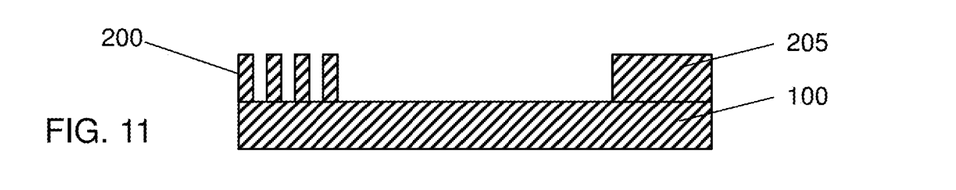

As shown in FIG. 11, the Si substrate 100 is trench-etched by using the mask layer 105 as an etching mask, so as to form the fin structures 200 and 205.

Figure 12:
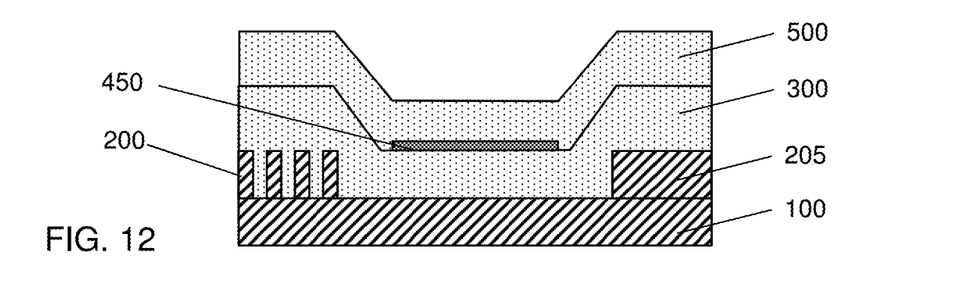

Then, similar operations as described with FIGS. 2-6 are performed, thereby forming the first dielectric layer 300, the first planarization resistance layer 450 and the second dielectric layer 500, as shown in FIG. 12. The first planarization resistance layer 450 is disposed in the area AR5.

In some embodiments, the first planarization resistance layer 450 is also formed in portions of area AR3, where no fin structures are disposed.

Figure 13:
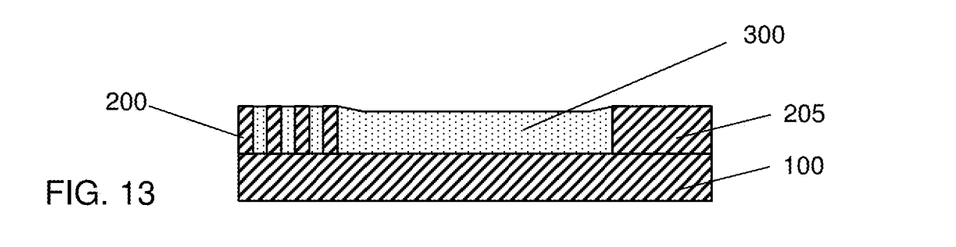

Subsequently, similar operations as described with FIGS. 7 and 8 are performed, thereby the planarized first dielectric layer 300 is obtained, as shown in FIG. 13. In FIG. 13, after the planarization operation, upper surfaces of the fin structures 200, 205 are exposed.

Figure 14:
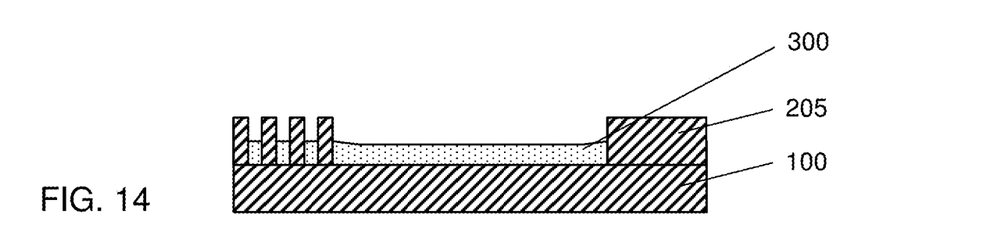

Then, as shown in FIG. 14, the first dielectric layer 300 is recessed so that the upper portions of the fin structures, which are to be used as channels of FinFETs, are exposed from the first dielectric layer 300.

Figure 15:
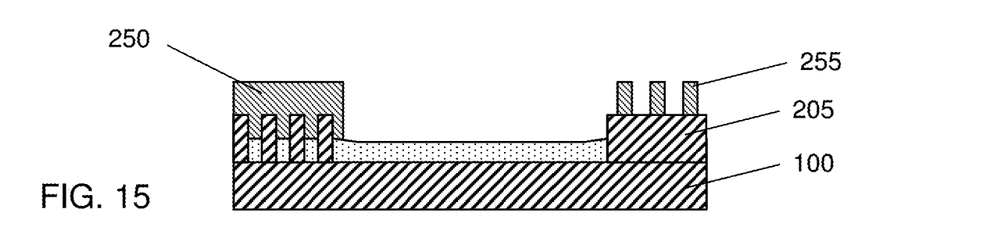

After the upper portions of the fin structures are exposed, gate structures 250, 255 are formed, as shown in FIG. 15.

Figure 16:
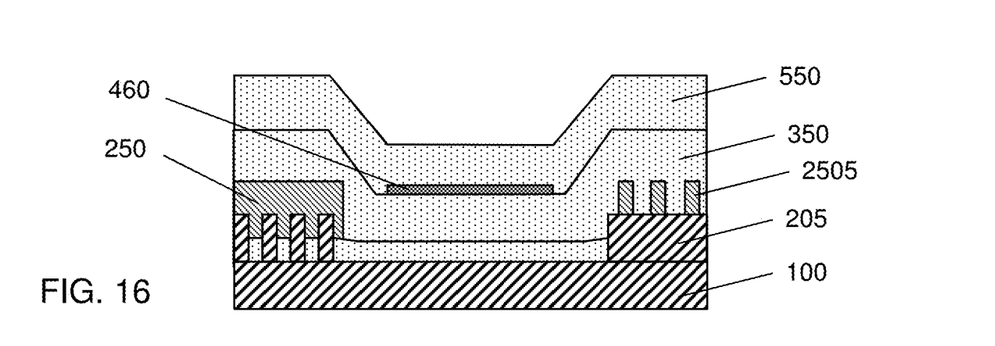

Then, similar operations as described with FIGS. 2-6 are performed, thereby forming the third dielectric layer 350, the second planarization resistance layer 460 and the fourth dielectric layer 550, as shown in FIG. 16. The second planarization resistance layer 460 is disposed in area AR5. In some embodiments, the second planarization resistance layer 460 is also formed in portions of area AR4, where no gate structures are disposed.

Figure 17:
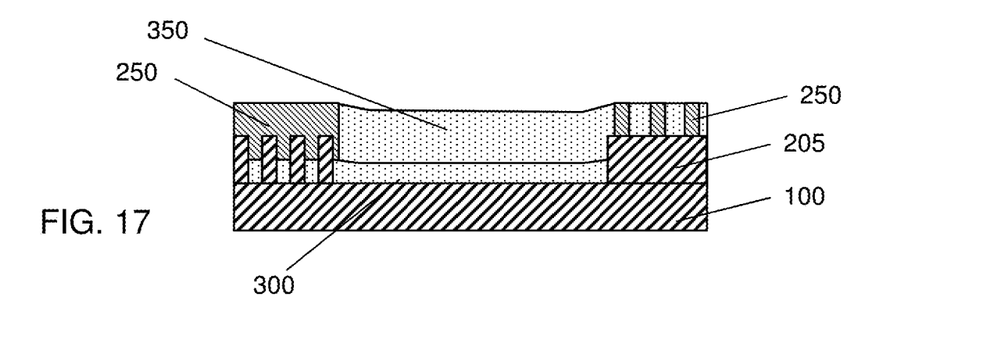

Subsequently, similar operations as described with FIGS. 7 and 8 are performed, thereby the planarized third dielectric layer 350 is obtained, as shown in FIG. 17. In FIG. 17, after the planarization operation, upper surface of the gate structures 250, 255 are exposed.

Figure 18:
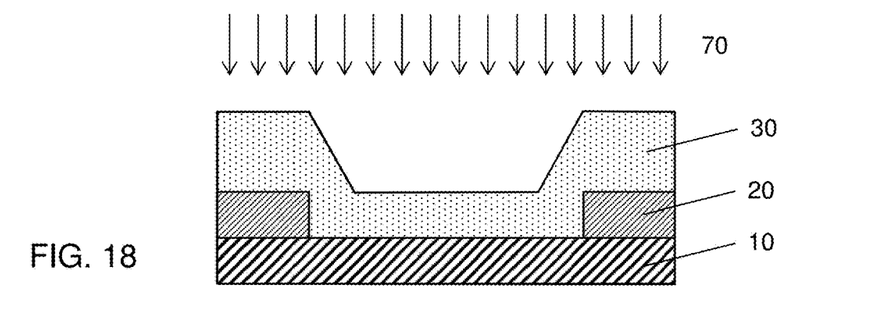
FIGS. 18 and 19 show exemplary sequential processes for manufacturing a semiconductor device according to another embodiment of the present disclosure.
Figure 19:
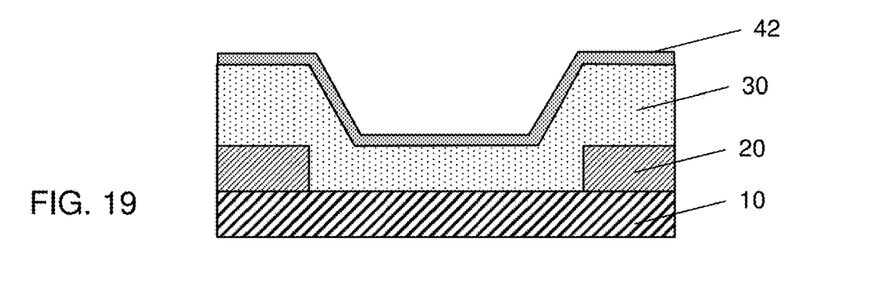

FIGS. 18 and 19 show exemplary sequential processes for manufacturing a semiconductor device according to another embodiment of the present disclosure. The same or similar operations, processes, configuration and/or materials as set forth with respect to FIGS. 1-17 may be employed in the following embodiments, and the detailed explanation may be omitted.

In this embodiment, a plasma treatment 70 is performed to modify the upper surface of the first dielectric layer 30, as shown in FIGS. 18 and 19. Ammonia ($NH_3$) and/or nitrogen ($N_2$) can be used as a source gas for the plasma treatment. The plasma treatment may include direct plasma or remote plasma at a temperature of about 100° C. to about 400° C. under a pressure of less than 100 Torr.

By the plasma treatment, a portion of the depth of about 10 nm to 100 nm of the upper surface of the first dielectric layer 30 is modified into a planarization resistance layer 42. In some embodiments, the thickness of the planarization resistance layer 42 is in a range from about 20 nm to about 50 nm.

Figure 20:
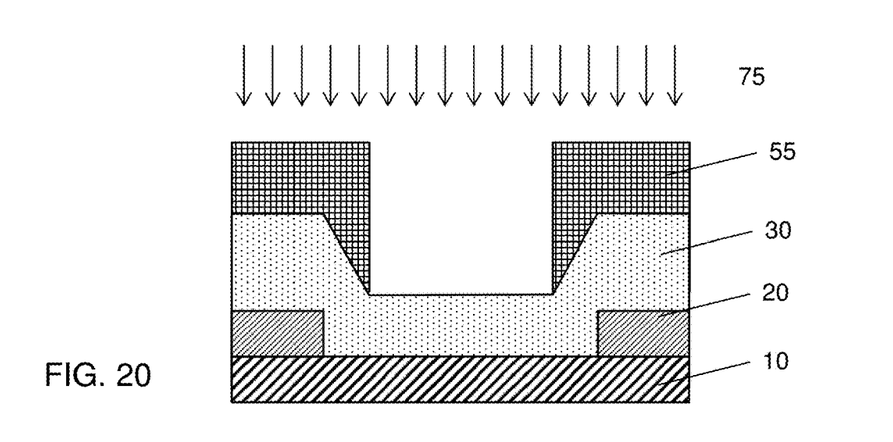
FIGS. 20 and 21 show exemplary sequential processes for manufacturing a semiconductor device according to another embodiment of the present disclosure.
Figure 21:
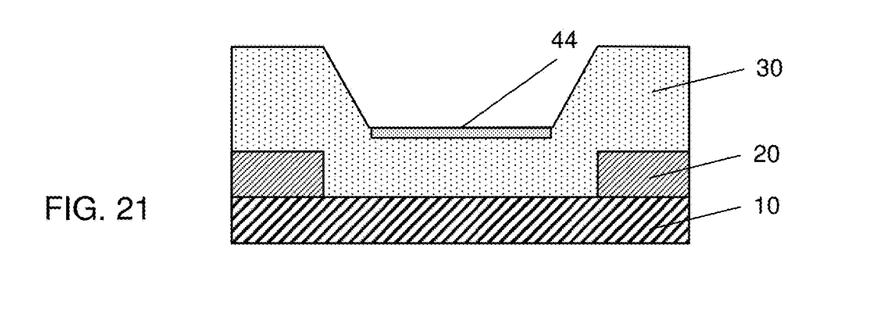

FIGS. 20 and 21 show exemplary sequential processes for manufacturing a semiconductor device according to another embodiment of the present disclosure.

In this embodiment, ion implantation is employed to introduce nitrogen into the surface of the first dielectric layer 30. As shown in FIG. 20, a mask pattern 55 having an opening is formed over the structures of FIG. 2. Then, nitrogen ions (or ions including nitrogen) 75 are implanted into the surface of the first dielectric layer 30. As shown in FIG. 21, by the ion implantation, a portion of the depth of about 10 nm to 100 nm of the upper surface of the first dielectric layer 30 is modified into the planarization resistance layer 44. In some embodiments, the thickness of the planarization resistance layer 44 is in a range from about 20 nm to about 50 nm.

The various embodiments or examples described herein offer several advantages over the existing art. For example, in the present disclosure, since the planarization resistance layer is formed in a portion where there are no underlying patterns, the dishing effect can be reduced.

It will be understood that not all advantages have been necessarily discussed herein, no particular advantage is required for all embodiments or examples, and other embodiments or examples may offer different advantages.

In accordance with one aspect of the present disclosure, in a method for manufacturing a semiconductor device, a first dielectric layer is formed over an underlying structure disposed on a substrate. A planarization resistance layer is formed over the first dielectric layer. A second dielectric layer is formed over the first dielectric layer and the planarization resistance layer. A planarization operation is performed on the second dielectric layer, the planarization resistance layer and the first dielectric layer. The planarization resistance film is made of a material different from the first dielectric layer.

In accordance with another aspect of the present disclosure, in a method for manufacturing a semiconductor device, fin structures are formed over a first area of a substrate. The substrate further includes a second area where the fin structures are not formed. A first dielectric layer is formed over the fin structures in the first area and the second area of the substrate. A first planarization resistance layer is formed over the first dielectric layer in the second area. A second dielectric layer is formed over the first dielectric layer and the first planarization resistance layer. A first planarization operation is performed on the second dielectric layer, the first planarization resistance layer and the first dielectric layer. The planarization resistance film is made of a material different from the first dielectric layer.

In accordance with another aspect of the present disclosure, a semiconductor device includes underlying structures disposed on a substrate, and a dielectric layer disposed over the underlying structures and the substrate. The substrate includes first areas where the underlying structures are disposed with a space smaller than a threshold space and second areas where the underlying structure are not disposed. A distance between adjacent second areas is equal to or more than the threshold space. An insulating material layer made of a different material than the dielectric layer is disposed in the second areas, and is not formed in the first areas.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a first dielectric layer over an underlying structure disposed on a substrate, and the underlying structure includes plural structures;
   forming a planarization resistance layer over the first dielectric layer;
   patterning the planarization resistance layer to form a patterned planarization resistance layer;
   forming a second dielectric layer over the first dielectric layer and the patterned planarization resistance layer so that a bottom of a concave of the second dielectric layer is positioned on the patterned planarization resistance layer; and
   performing a planarization operation on the second dielectric layer, the patterned planarization resistance layer and the first dielectric layer to remove the first dielectric layer and the second dielectric layer on top surfaces of the plural structures and to remove the patterned planarization resistance layer,
   wherein the patterned planarization resistance layer is made of a material different from the first dielectric layer and having a lower etching rate in the planarization operation than the first and second dielectric layers to reduce a dishing amount between the plural structures, wherein the planarization resistance layer includes one or more of SiN, SiON, SiCN, SiC, AlO and AlON, and wherein a difference in height, between the top surfaces of the plural structures after removing the first and second dielectric layers and a lowest portion of an upper surface of the first dielectric layer between the plural structures after removing the planarization resistance layer, is between 1 nano meter and 10 nano meters.

2. The method of claim 1, further comprising:
performing the planarization operation on the second dielectric layer, the patterned planarization resistance layer and the first dielectric layer to completely remove the first dielectric layer and the second dielectric layer on top surfaces of the plural structures and to completely remove the patterned planarization resistance layer between the plural structures.

3. The method of claim 1, wherein the forming the planarization resistance layer comprises modifying a surface layer of the first dielectric layer by introducing nitrogen into the first dielectric layer.

4. The method of claim 3, wherein:
the nitrogen is introduced into the surface layer of the first dielectric layer by using plasma with nitrogen containing gas, and
the forming the planarization resistance layer further comprises patterning the modified surface layer to form the planarization resistance layer.

5. The method of claim 3, wherein the nitrogen is introduced into the surface of the first dielectric layer by ion implantation through an opening of a mask pattern formed over the first dielectric layer.

6. The method of claim 1, wherein the patterned planarization resistance layer is formed over a concave portion of the first dielectric layer.

7. The method of claim 1, wherein the planarization operation includes a chemical mechanical polishing operation.

8. The method of claim 1, wherein:
the planarization resistance layer is formed over an area where a density of the plural structures is less than a threshold density, and
the threshold density is determined by a space between the plural structures.

9. A method for manufacturing a semiconductor device, comprising:
forming fin structures over a first area of a substrate, the substrate further including a second area where the fin structures are not formed;
forming a first dielectric layer over the fin structures in the first area and the second area of the substrate;
forming a first planarization resistance layer over the first dielectric layer in the second area;
patterning the first planarization resistance layer to form a patterned first planarization resistance layer;
forming a second dielectric layer over the first dielectric layer and the patterned first planarization resistance layer so that a bottom of a concave of the second dielectric layer is positioned on the patterned first planarization resistance layer; and
performing a first planarization operation on the second dielectric layer, the patterned first planarization resistance layer and the first dielectric layer to remove the first dielectric layer and the second dielectric layer on top surfaces of the fin structures and to remove the patterned first planarization resistance layer,
wherein the patterned first planarization resistance layer is made of a material different from the first dielectric layer and having a lower etching rate in the first planarization operation than the first and second dielectric layers to reduce a dishing amount between the fin structures, wherein the first planarization resistance layer includes one or more of SiN, SiON, SiCN, SiC, AlO and AlON, and wherein a difference in height, between the top surfaces of the fin structures after removing the first and second dielectric layers and a lowest portion of an upper surface of the first dielectric layer between the fin structures after removing the first planarization resistance layer, is between 1 nano meter and 10 nano meters.

10. The method of claim 9, further comprising: performing the first planarization operation on the second dielectric layer, the patterned first planarization resistance layer and the first dielectric layer to completely remove the first dielectric layer and the second dielectric layer on top surfaces of the fin structures and to completely remove the patterned first planarization resistance layer between the fin structures.

11. The method of claim 9, wherein the fin structures are disposed in the first area with spaces between the fin structures, the spaces being equal to or a smaller than a first threshold space.

12. The method of claim 11, wherein:
two first areas are provided on the substrate with the second area interposed therebetween, and
a distance between the first areas is more than the first threshold space.

13. The method of claim 9, further comprising:
forming gate structures over a third area of the substrate, the substrate further including a fourth area where the gate structures are not formed;
forming a third dielectric layer over the gate structures in the third area and the fourth area of the substrate;
forming a second planarization resistance layer over the third dielectric layer in the fourth area;
forming a fourth dielectric layer over the third dielectric layer and the second planarization resistance layer; and
performing a planarization operation on the fourth dielectric layer, the second planarization resistance layer and the third dielectric layer.

14. The method of claim 13, wherein the gate structures are disposed in the third area with spaces between the gate structures, the spaces being equal to or a smaller than a second threshold space.

15. The method of claim 14, wherein:
two third areas are provided on the substrate with the fourth area interposed therebetween, and a distance between the third areas is more than the second threshold space.

16. The method of claim 9, further comprising:
recessing the first dielectric layer so that upper portions of the fin structures are exposed after the first planarization operation;
forming gate structures over the exposed fin structures;
forming a third dielectric layer over the gate structures, the fin structures and the second area of the substrate;
forming a second planarization resistance layer over the third dielectric layer in the second area;
forming a fourth dielectric layer over the third dielectric layer and the second planarization resistance layer; and
performing a planarization operation on the fourth dielectric layer, the second planarization resistance layer and the third dielectric layer.

17. The method of claim 9, wherein the first planarization operation includes a chemical mechanical polishing operation.

18. A method for manufacturing a semiconductor device, comprising:
forming a first dielectric layer over a first fin structure and a second fin structure disposed on a semiconductor substrate, wherein the first fin structure and the second fin structure are spaced apart from each other, and a length of the first fin structure extends along a first direction and a length of the second fin structure extends along a second direction substantially perpendicular to the first direction;

forming and patterning a first planarization resistance layer to form a patterned first planarization resistance layer over the first dielectric layer in an area between the first and second fin structures;

forming a second dielectric layer over the first dielectric layer and the patterned first planarization resistance layer so that a bottom of a concave of the second dielectric layer is positioned on the patterned first planarization resistance layer;

performing a first planarization operation on the second dielectric layer, the patterned first planarization resistance layer, and the first dielectric layer to remove the first dielectric layer and the second dielectric layer on top surfaces of the first fin structure and the second fin structure and to remove the patterned first planarization resistance layer, wherein the patterned first planarization resistance layer has a lower etching rate in the first planarization operation than the first and second dielectric layers to reduce a dishing amount between the first fin structure and the second fin structure, wherein the first planarization resistance layer includes one or more of SiN, SiON, SiCN, SiC, AlO and AlON, and wherein a difference in height, between the top surfaces of the first and second fin structures after removing the first and second dielectric layers and a lowest portion of an upper surface of the first dielectric layer between the first and second fin structures after removing the first planarization resistance layer, is between 1 nano meter and 10 nano meters;

recessing the first dielectric layer so that the first and second fin structures protrude from the first dielectric layer;

forming a first gate structure over the first fin structure and a second gate structure over the second fin structure, wherein a length of the first gate structure extends along the second direction and a length of the second gate structure extends along the first direction;

forming a third dielectric layer over the first gate structure, the second gate structure, the first fin structure, and the second fin structure;

forming a second planarization resistance layer over the third dielectric layer in the area between the first and second fin structures;

forming a fourth dielectric layer over the third dielectric layer and the second planarization resistance layer; and performing a second planarization operation on the fourth dielectric layer, the second planarization resistance layer, and the third dielectric layer.

19. The method of claim 18, wherein the first planarization operation includes a chemical mechanical polishing operation.

20. The method of claim 18, wherein the second planarization operation includes a chemical mechanical polishing operation.

* * * * *